United States Patent
Vanspauwen et al.

(10) Patent No.: US 7,742,905 B2
(45) Date of Patent: Jun. 22, 2010

(54) METHOD AND SYSTEM FOR DYNAMICALLY ADJUSTING SPEED VERSUS ACCURACY OF COMPUTER PLATFORM SIMULATION

(75) Inventors: Niels Vanspauwen, Heverlee (BE); Tom Michiels, Leuven (BE); Karl Van Rompaey, Nieuwpoort (BE)

(73) Assignee: Coware, Inc., San Jose, CA (US)

( * ) Notice: Subject to any disclaimer, the term of this patent is extended or adjusted under 35 U.S.C. 154(b) by 874 days.

(21) Appl. No.: 11/066,945

(22) Filed: Feb. 25, 2005

(65) Prior Publication Data

US 2006/0195825 A1 Aug. 31, 2006

(51) Int. Cl.
- G06G 7/62 (2006.01)
- G06F 17/50 (2006.01)
- G06F 9/45 (2006.01)
- G06F 9/455 (2006.01)
- G06F 13/24 (2006.01)
- G06F 11/00 (2006.01)

(52) U.S. Cl. .................. 703/13; 703/22; 703/26; 710/260; 710/261; 710/262; 714/741

(58) Field of Classification Search ............. 703/2, 703/13, 22, 26; 710/260, 261; 714/741
See application file for complete search history.

(56) References Cited

U.S. PATENT DOCUMENTS

| | | |
|---|---|---|
| 4,051,352 A | 9/1977 | Eichelberger et al. |
| 5,371,746 A | 12/1994 | Yamashita et al. |
| 5,410,685 A | 4/1995 | Banda et al. |
| 5,452,437 A | 9/1995 | Richey et al. |
| 5,784,552 A | 7/1998 | Bishop et al. |
| 5,790,778 A | 8/1998 | Bush et al. |
| 5,819,093 A | 10/1998 | Davidson et al. |
| 5,911,073 A | 6/1999 | Mattson et al. |
| 6,083,281 A | 7/2000 | Diec et al. |
| 6,145,099 A | 11/2000 | Shindou |
| 6,167,479 A * | 12/2000 | Hartnett et al. ............. 710/260 |
| 6,418,392 B1 | 7/2002 | Rust et al. |
| 6,453,424 B1 * | 9/2002 | Janniello ................... 713/500 |
| 6,516,460 B1 | 2/2003 | Merks et al. |

(Continued)

FOREIGN PATENT DOCUMENTS

KR    1998-0032143    7/1998

(Continued)

OTHER PUBLICATIONS

Bedichek, Robert. "Talisman: Fast and Accurate Multicomputer Simulation" ACM 1995.*

(Continued)

*Primary Examiner*—Kamini S Shah
*Assistant Examiner*—Shambhavi Patel

(57) ABSTRACT

Executing a simulation of a computer platform, the simulation including simulation models. A dynamic quantum is accessed whose current value specifies a maximum number of units of execution a simulation model is allowed to perform without synchronizing with another simulation model. The dynamic quantum may be received from a user. Respective simulation models are invoked for execution with the current value of the dynamic quantum provided to each of the simulation models. The method also comprises modifying the value of the dynamic quantum based on a simulation event.

27 Claims, 12 Drawing Sheets

U.S. PATENT DOCUMENTS

| | | | |
|---|---|---|---|
| 6,587,995 | B1 | 7/2003 | Duboc et al. |
| 6,601,229 | B1 | 7/2003 | Niederer et al. |
| 6,625,572 | B1 | 9/2003 | Zemlyak et al. |
| 6,718,294 | B1 | 4/2004 | Bortfeld |
| 6,760,903 | B1 | 7/2004 | Morshed et al. |
| 6,826,717 | B1 | 11/2004 | Draper et al. |
| 6,882,968 | B1 * | 4/2005 | Linden ............... 703/26 |
| 7,133,820 | B2 | 11/2006 | Pennello et al. |
| 7,185,319 | B2 | 2/2007 | Kaler et al. |
| 2002/0174415 | A1 | 11/2002 | Hines |
| 2004/0010778 | A1 | 1/2004 | Kaler et al. |
| 2005/0183066 | A1 | 8/2005 | Jabori |
| 2005/0256694 | A1 * | 11/2005 | Taylor ............... 703/22 |
| 2006/0069953 | A1 | 3/2006 | Lippett et al. |

FOREIGN PATENT DOCUMENTS

| | | |
|---|---|---|
| KR | 19980032143 | 7/1998 |
| KR | 20030058128 | 7/2003 |

OTHER PUBLICATIONS

Burger et al. "Accuracy vs. Performance in Parallel Simulation of Interconnection Networks" IEEE 1995.*

Brewer et al. "Proteus: A High-Performance Parallel-Architecture Simulator", 1991.*

Legedza et al. "Reducing Synchronization Overhead in Parallel Simulation", IEEE 1996.*

Mukherjee et al. "Wisconsin Wind Tunnel II: A Fast and Portable Architecture Simulator", Workshop on Performance Analysis and Its Impact on Design, Jun. 1997.*

Guthery, Scott. "Self-Timing Programs and the Quantum Scheduler", ACM 1998, vol. 31.*

Prakash, et al. "MPI-SIM: Using Parallel Simulation to Evaluate MPI Programs", Proceedings of 1998 Winter Simulation Conference, IEEE 1998.*

Coulaud, et al. "Toward a Distributed Computational Steering Environment Based on Corba" 1999.

Bagrodia, et al. "Parsec- A Parallel Simulation Environment for Complex Systems" 1998.

Cunha, et al. "A Debugging Engine for a Parallel and Distributed Environment" 1996.

Non-Final Office Action Dated Jan. 10, 2008; U.S. Appl. No. 11/066,841.

Final Office Action Dated Aug. 15, 2008; U.S. Appl. No. 11/066,841.

Non-Final Office Action Dated Dec. 2, 2008; U.S. Appl. No. 11/066,841.

Notice of Allowance Dated Aug. 21, 2009; U.S. Appl. No. 11/066,841.

Coulaud et al., "Toward a Distributed Computational Steering Enviornment Based on Corba", 1999.

Bagrodia et al., "PARSEC: A Parallel Simulation Environment for Complex Systems", 1998.

Cunha et al., "A Debugging Engine for a Parallel and Distributed Environment", 1996.

Looney, Douglas, "Interactive Control of a Parallel Simulation Froma Remote Graphics Workstaion", Dec. 14, 1993.

Magnusson et al., "Simics: A Full System Simulation Platform", IEEE 2002.

Girod et al., "A System for Simulation, Emulation, and Deployment of Heterogeneous Sensor Networks", SenSys 2004.

Herrod, Stephen, "Using Complete Machine Simulation to Understand Computer System Behavior", Feb. 1998.

* cited by examiner

METHOD AND SYSTEM FOR DYNAMICALLY ADJUSTING SPEED VERSUS ACCURACY OF COMPUTER PLATFORM SIMULATION

RELATED CASE

This Application is related to U.S. patent application Ser. No. 11/066,841 by VanSpauwen, et al., filed on Feb. 25, 2005, entitled "Interface Converter For Unified View Of Multiple Computer System Simulations, and assigned to the assignee of the present invention.

FIELD OF THE INVENTION

Embodiments of the present invention relate to the field of software tools for debugging computer architectures using simulation models, such as processor and hardware simulation models. Specifically, embodiments of the present invention relate to methods and systems that dynamically tradeoff speed versus accuracy when simulating a computer platform.

BACKGROUND ART

Recently, the evolution of embedded systems has shown a strong trend towards application-specific, single-chip solutions. As a result, application-specific instruction set processors (ASIP) are more and more replacing off-the-shelf processors in such systems-on-chip (SoC). One of the key factors for a successful design of application-specific instruction set processors (ASIP) is an efficient architecture exploration phase. The objective of the architecture exploration is to reduce the huge design space in order to find the best-suited architecture for a given application under a number of constraints, such as performance, power consumption, chip size, and flexibility. Although there are a number of analytical approaches, large parts of the design space exploration still have to be carried out by simulating alternative architecture implementations with simulation models. It becomes obvious that the design methodology and simulation performance have a significant impact on the efficiency of the exploration process, hence, on the quality of the architecture implementation and the design time. Moreover, the design of the processor core (including the instruction set) and peripherals have very different simulation requirements.

FIG. 1 depicts a conventional simulation environment used to simulate an architecture (or platform) that in this case includes multiple processor cores and hardware, such that the platform may be debugged. The hardware debugger 150 executes a simulation kernel 160 comprising a hardware simulation model 180 and two processor core simulation models (CPU1 and CPU2 simulations 175). The hardware debugger 150 has an application program interface (API) to communicate with the hardware simulation model 180. However, in order for the hardware debugger 150 to communicate with the processor core simulation models 175, which is needed to perform the overall simulation, the processor core simulations 175 each have a software wrapper 185. Processor core debuggers 170 are used to control and observe the processor core simulations 175, such that the processor cores may be debugged.

Hardware developers typically need cycle accurate simulation models and are willing to accept a slower simulation to get to full cycle accuracy. A cycle-accurate simulation model is one in which the state of the simulation model at the end of each clock cycle accurately reflects the state a real-world processor or hardware being modeled would have. Software developers on the other hand are much less dependent on complete cycle accuracy of the simulation model. Software developers desire very high simulation speeds and are typically willing to trade simulation accuracy for speed. However, even if the simulation model is not cycle accurate, it still needs to correctly model the software. That is, even if the state of the simulation model does not necessarily reflect the state that the real-world processor or hardware would have at the end of each clock cycle, the overall behavior of the simulation model must still match the real-world processor or hardware being modeled. Thus, the simulation should be behaviorally accurate. Furthermore, some software developers (e.g. device driver developers) need full cycle accuracy in only some parts of the simulation model.

Conventionally, hardware developers and software developers use different simulation models because of the aforementioned different simulation requirements. Typically, a set of simulation models are used to simulate a computer platform. For example, the set may comprise a processor core simulation, an instruction set simulation, a memory simulation model, a bus simulation model, and simulation models for various peripherals (e.g., hardware simulations). Time and effort is spent developing separate sets of simulation models for the hardware and the software developers. Further, the two sets of simulation models must be validated as being functionally equivalent. Also, it is difficult to achieve a fast simulation that has behaviorally correct simulation results. Typically, substantial manual work is required to obtain to high simulation speed while still obtaining behaviorally correct simulation results

SUMMARY OF THE INVENTION

Therefore, it would be advantageous to provide a method and system that allows a single set of simulation models to be used for either a relatively slow cycle accurate simulation or a substantially faster behaviorally accurate simulation that is not cycle accurate. It would be further advantageous to reduce the time required to develop simulation models that are used for different aspects (e.g., software, hardware) of the same computer platform. It would be further advantageous to eliminate the need to validate that two or more simulation models are functionally equivalent. It would be still further advantageous to reduce the effort needed to achieve fast simulations while still getting correct (e.g., behaviorally accurate) simulation results.

Accordingly, embodiments of the present invention allow a single set of simulation models to be used for either a slower cycle accurate simulation or for a faster behaviorally accurate simulation. Embodiments of the present invention allow the simulation to be dynamically adjusted for a speed versus accuracy tradeoff "on-the-fly", e.g., without recompiling the simulation. Embodiments of the present invention reduce the time required to develop simulation models that are used for different aspects (e.g., software, hardware) of the same computer architecture. Embodiments of the present invention may eliminate the need to validate that two or more set of simulation models used for the same computer platform are functionally equivalent. Embodiments of the present invention reduce the effort to achieve fast simulations while still obtaining behaviorally correct simulation results. Embodiments of the present invention provide these advantages and others not specifically mentioned above but described in the sections to follow.

One embodiment in accordance with the present invention is a computer readable medium having stored thereon instructions for implementing a method of simulating a computer platform. The instructions comprise simulation models for modeling portions of the computer system platform. The instruction also comprise a simulation engine operable to control execution of the simulation models based on a dynamic quantum. The simulation engine instructs respective simulations to perform a number of execution units up to the current value of the dynamic quantum. The simulation engine is able to modify the dynamic quantum based on a simulation event.

Another embodiment in accordance with the present invention is a computer-implemented method of executing a simulation of a computer platform. The simulation comprises a plurality of simulation models. The method comprises accessing a dynamic quantum whose current value specifies a maximum number of units of execution that a simulation of the plurality of simulation models is allowed to perform without synchronizing with another simulation model. The dynamic quantum may be received from a user. The method also includes invoking respective simulation models for execution and providing the current value of the dynamic quantum to each of the simulation models. Therefore, each simulation model may run for up to the current value without stopping to, for example, synchronize with other simulations. The method also comprises modifying the value of the dynamic quantum based on a simulation event.

BRIEF DESCRIPTION OF THE DRAWINGS

The accompanying drawings, which are incorporated in and form a part of this specification, illustrate embodiments of the invention and, together with the description, serve to explain the principles of the present invention.

DETAILED DESCRIPTION OF THE INVENTION

Figure 1:
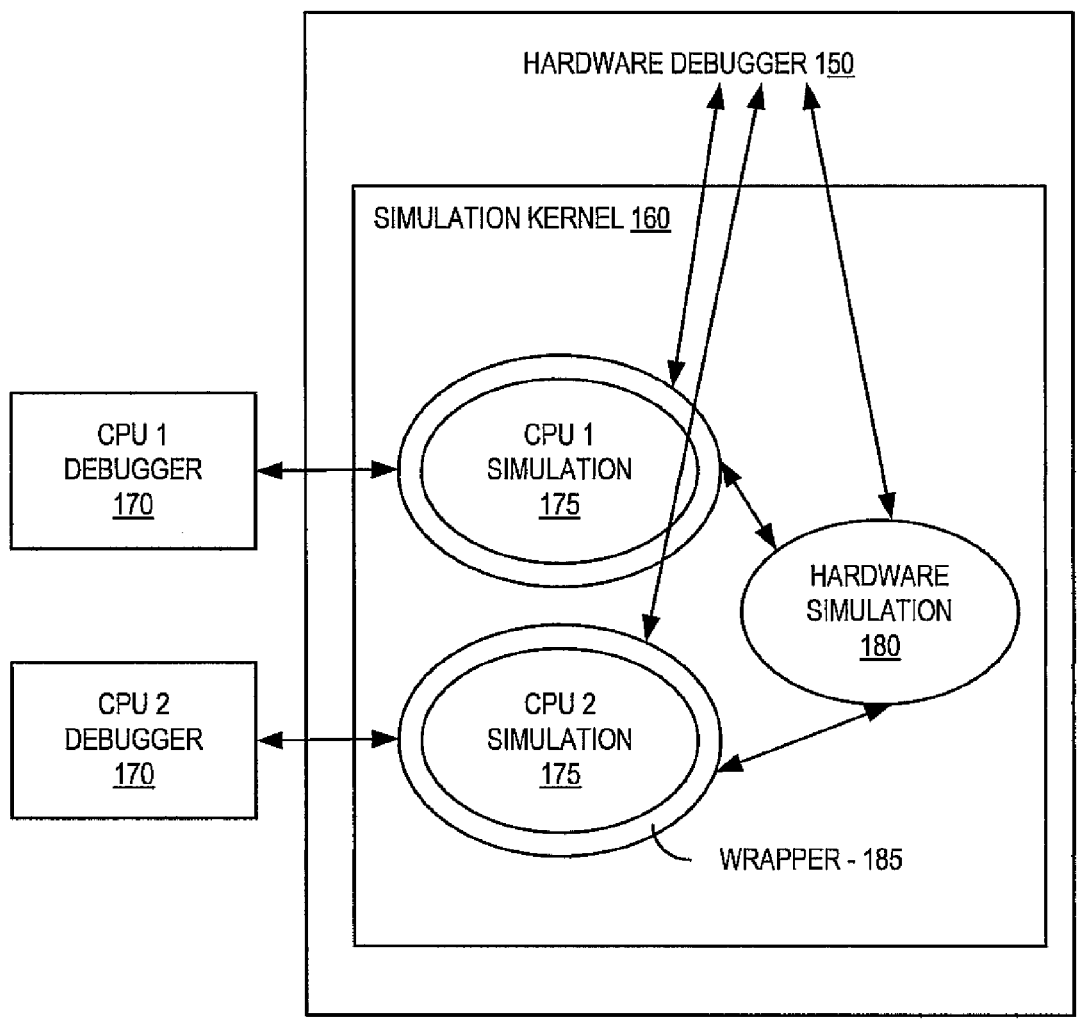
FIG. 1 is a diagram of a conventional debugging environment employing separate debuggers for each simulation.

In the following detailed description of embodiments of the present invention numerous specific details are set forth in order to provide a thorough understanding of the present invention. However, it will be recognized by one skilled in the art that the present invention may be practiced without these specific details or with equivalents thereof. In other instances, well-known methods, procedures, and components have not been described in detail as not to unnecessarily obscure aspects of the present invention.

Notation and Nomenclature

Some portions of the detailed descriptions that follow are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "identifying" or "receiving" or "converting" or "processing" or "passing" or "computing" or "determining" or "maintaining" or "storing" or "constructing" or "accessing" or "selecting" or "forming" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Unified View of Simulations

Embodiments of the present invention allow a computer system platform developer to have a unified view of the platform under development. Embodiments of the present invention provide a unified view of various simulations being used to simulate the computer platform. For example, by allowing a unified view of multiple simulations, embodiments of the present invention allow a user to observe and control one or more processor core simulations, a hardware simulation, etc., from a single debugging application. Embodiments of the present invention allow breakpoints and watchpoints to be set using a combination of events in different simulations.

Figure 2:
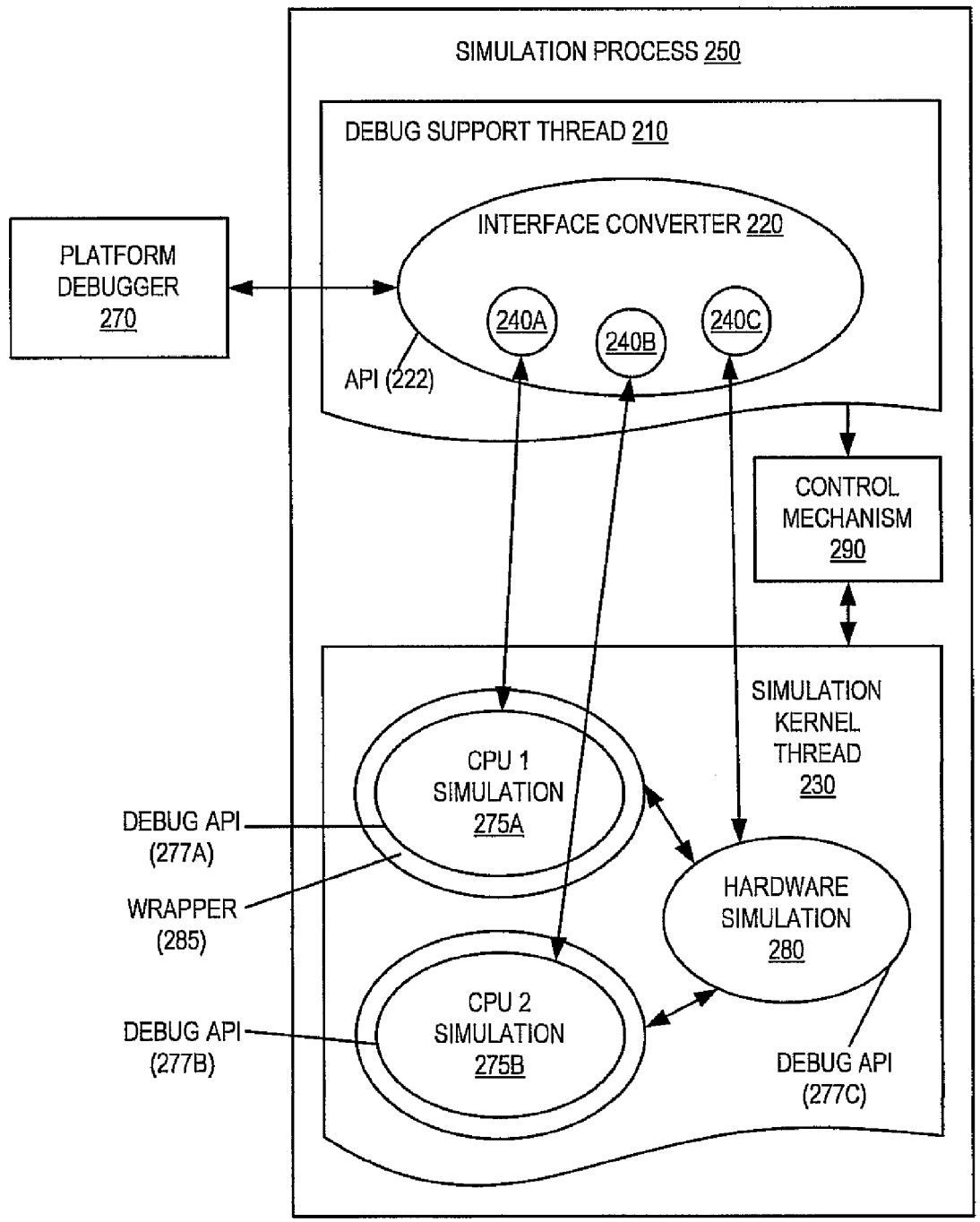
FIG. 2 is a diagram of a system for presenting a unified view of multiple simulations, in accordance with an embodiment of the present invention.

FIG. 2 is a diagram of a system for presenting a unified view of multiple simulations, in accordance with an embodiment of the present invention. The simulation process 250 comprises a debug support thread 210 and a simulation kernel thread 230. The simulation kernel thread 230 comprises multiple simulations (275a, 275b, 280), each of which simulates one or more aspects or portions of the computer system platform. In this case, the simulations include two processor core simulations 275a, 275b and a separate hardware simulation 280. However, the simulation kernel thread 230 may contain other types of simulations. Further, it is not required that a given simulation be limited to only one portion or aspect of the platform such as hardware, software, or a processor core. Moreover, it is not required that any particular type of simulation be present.

The simulation kernel thread controls the execution of the various simulations. In one embodiment, the simulation kernel thread invokes the various simulations, wherein each simulation is allowed to execute for up to a pre-determined number of clock cycles without stopping to, for example, synchronize with other simulations. The pre-determined number of clock cycles is referred to herein as a quantum. The simulation may halt prior to the end of the quantum of clock cycles. For example, if the simulation encounters a breakpoint or watchpoint it halts prior to completing the quantum of clock cycles.

The quantum is dynamically adjustable and may be based on simulation events. If the quantum is set relatively high, the computer system platform simulation may be faster but possibly less accurate. If the quantum is set lower, the platform simulation may be slower and possibly more accurate. For example, a hardware designer may desire a very accurate simulation, whereas a software developer may desire a faster simulation and be willing to trade some accuracy.

The platform debugger 270 is a tool that allows a user to observe and control the simulations 275a, 275b, 280, wherein the platform being simulated may be debugged. The debug support thread 210 comprises an interface converter 220 that allows the platform debugger 270 to have a unified view of all of the simulations 275a, 275b, 280 in the simulation kernel thread 230. The interface converter 220 presents an external API 222 to the platform debugger 270. Each of the simulations has a debug interface 277a-c that allows observation and control of the actual simulation. The interface converter has API converter blocks 240a-c that each convert from the external API to the respective debug APIs used by each of the simulations.

Thus, the platform debugger 270 has a uniform view to observe and control the simulations 275a, 275b, 280. For example, the platform debugger 270 may use an API call to inspect or to modify a simulation. In one embodiment, to facilitate synchronization of the simulations, API calls that modify a simulation are allowed only when the simulation is halted. The inter-process communication between the platform debugger 270 and the simulation process 250 is implemented with the Common Object Request Broker Architecture (CORBA), in one embodiment. However, inter-process communication is not limited to CORBA. The platform debugger 270 may execute on the same computer system as the simulation process 250. Alternatively, the platform debugger 270 executes on a different computer system than the simulation process 250. If desired, "stand-alone" debuggers (not depicted in FIG. 2) that control and observe only one simulation may be added to the debugging environment.

Some of the simulations may have a software wrapper 285, in order to allow inter-simulation communication. For example, the CPU1 and CPU2 simulations 275a, 275b each have their own software wrapper 285 to allow communication with the hardware simulation 280. However, the platform debugger 270 does not need the software wrappers 285 to control and observe the simulations 275a, 275b, 280.

Still referring to FIG. 2, the simulation process 250 comprises a control mechanism 290 for halting and starting execution of the simulation kernel thread 230. Furthermore, embodiments of the present invention synchronize the various simulations at various points in their execution. In other words, the simulations are halted at a common point in execution. For example, the simulations may execute sequentially and may be aware of a common clock such that each simulation can be halted at the same clock cycle (e.g., a common point in their respective executions). In one embodiment, the control mechanism 290 comprises a semaphore, although the present invention is not so limited.

The debug support thread 210 allows continued viewing of the simulations when they are halted. When a breakpoint or watchpoint condition is detected, the control mechanism 290 is used to halt execution of all simulation processes. For example, if the CPU 1 simulation 275a detects that a breakpoint is hit, it may signal the control mechanism 290, which halts the execution of the entire simulation kernel thread 230.

While the simulation kernel thread 230 is halted the debug support thread 210 continues to run, wherein the platform debugger 270 has continued visibility to the simulations. In order to wake up the simulation kernel thread 230, the debug support thread 210 may signal the control mechanism 290, wherein the simulation kernel thread 230 resumes execution.

As used herein, the term thread may apply to an operating system process. However, as used throughout this description, the term thread is not limited to an operating system process. In some embodiments, the thread may be a part of an application program process.

Embodiments of the present invention allow a user to set halt-points in the simulations. Halt-points may include breakpoints, watchpoints, and the like. A breakpoint typically refers to a location in code, wherein the simulation halts and passes control of execution to the debugger when the code is hit. A watchpoint typically refers to a data access (e.g., a read or write of memory, hardware register, etc.), wherein a simulation halts and passes control of execution to the debugger when the data access occurs. Haltpoints are not limited to the examples herein and may be triggered by any event related to a simulation.

Furthermore, embodiments of the present invention allow a user to set multi-simulation halt-points. As used throughout this description, the term multi-simulation halt-point, multi-simulation breakpoint, multi-simulation watchpoint, multi-simulation breakpoint/watchpoint, or the like means that the halt-point or the like is based on events in two different simulations. For example, the events may be the combination of the program counter in the CPU 1 simulation 275a reaching a user-defined value and an access to a register of a hardware simulation 280.

Figure 3:
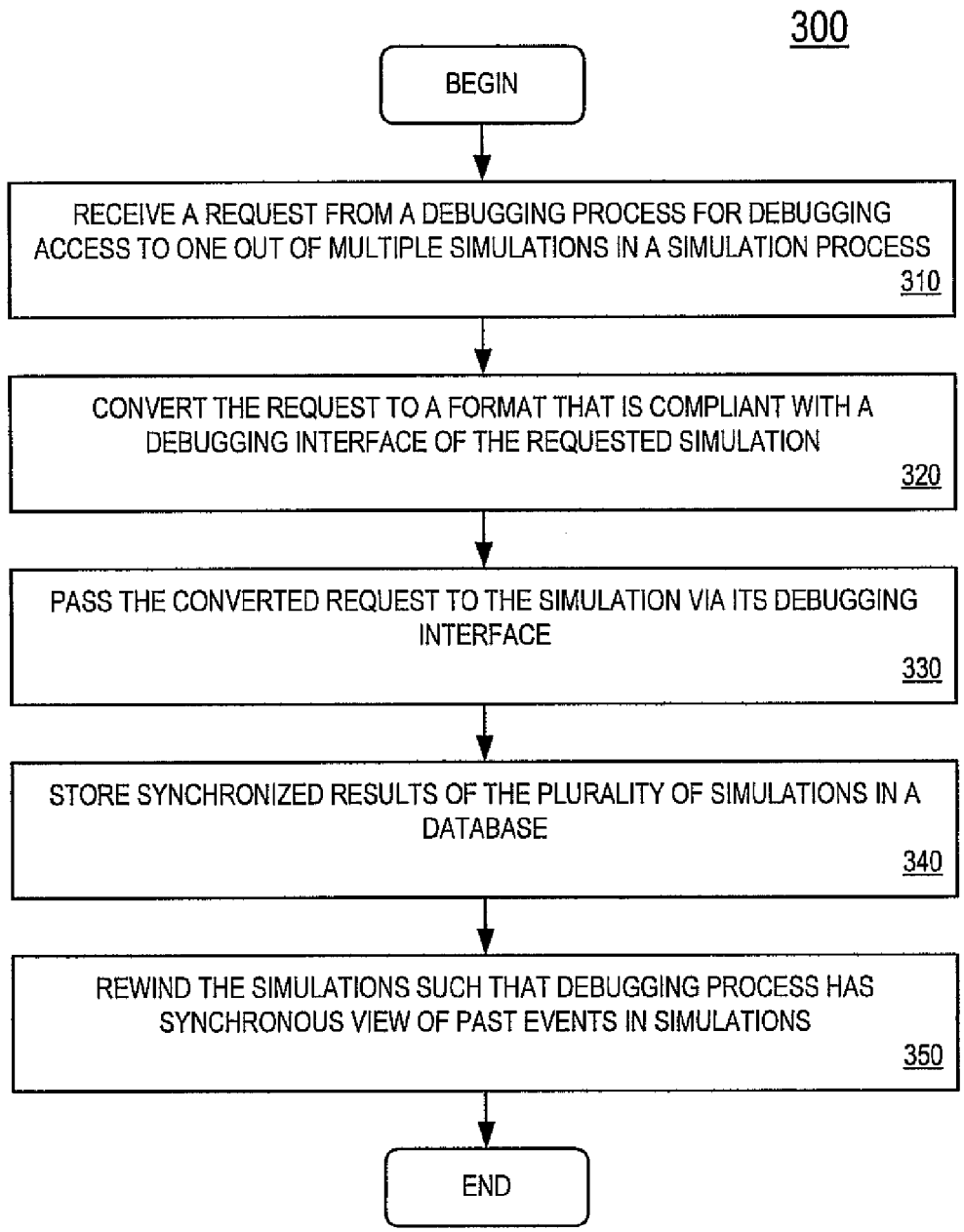
FIG. 3 is a flowchart illustrating a computer-implemented method of facilitating debugging via circuit simulations.

FIG. 3 is a flowchart illustrating a computer-implemented method of facilitating debugging via circuit simulations. Step 310 is receiving a request from a debugging process for debugging access to one of a plurality of simulations in a simulation process. Debugging access allows observation and control of the simulations. The request may be received by a debug support thread in the simulation process. Further, the plurality of simulations may be executing in a separate thread in the simulation process. The simulations have different debugging interfaces from each other for control and observation of the actual simulation. For example, referring to FIG. 2, each of the simulations 275a, 275b, and 280 have a different debugging interface, wherein the interface converter 220 uses three different interface converter blocks 240a-c to interface with the simulations.

Step 320 is converting the request to a format that is compliant with a debugging interface of the requested simulation. Step 320 may be performed by one of the interface converter blocks 240.

Step 330 is passing the converted request to the simulation via the debugging interface. Thus, the debugging process (e.g., platform debugger 270) has debugging access to the simulations. Throughout this application the term debugging access with respect to a simulation means access that allows control and observation of the simulation. In one embodiment, the request is for establishing multi-simulation breakpoints.

Step 340 is storing synchronized results of the simulations in a database. The database stores information that allows the results from each simulation to be compared at like points in time or execution. Embodiments of the present invention allow the simulations to be rewound, such that stored values may be viewed by the debugger. Moreover, the synchronization of the simulations is maintained. Moreover, the debugger can step through the results, wherein the results of all simulations are stepped together.

Step 350 is rewinding the simulations. For example, the results stored in the database are presented to the debugger, wherein the debugger views the results synchronized by time as measured by clock cycles.

Figure 4:
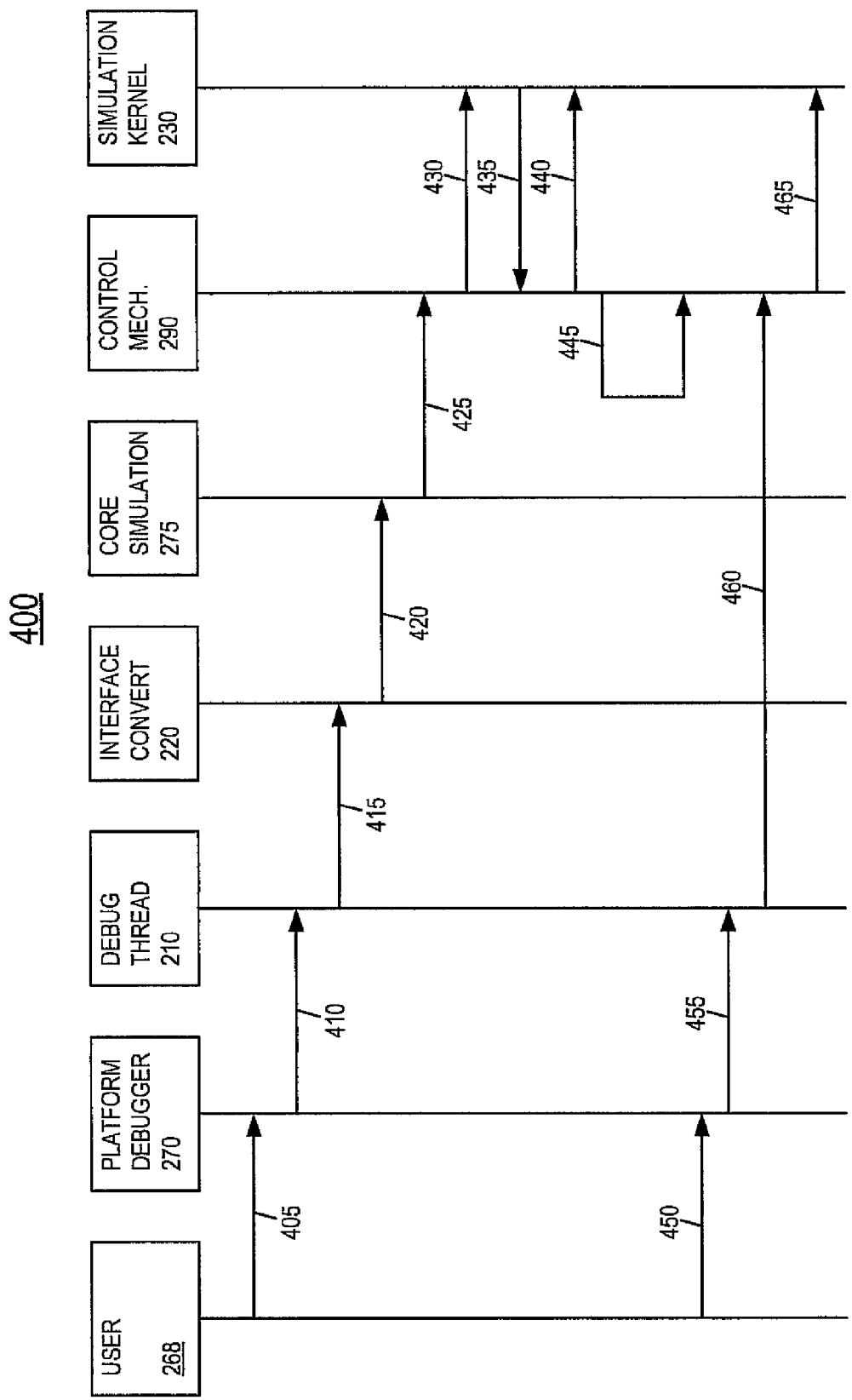
FIG. 4 illustrates a breakpointing sequence diagram, in accordance with an embodiment of the present invention.

FIG. 4 illustrates a breakpointing sequence diagram 400, in accordance with an embodiment of the present invention. In one embodiment, a semaphore is used as the control mechanism. However, the control mechanism is not limited to a semaphore. To set a breakpoint, a user 268 inputs the breakpoint information to the platform debugger (arrow 405). In response thereto, the platform debugger sends a message to the debug support thread identifying the processor core simulation and breakpoint information (arrow 410). The debug thread uses the interface converter to convert from the external API to the debug API for the processor core simulation (arrow 415). The breakpoint information is then passed on to the core simulation (arrow 420).

When the breakpoint is hit, the processor core simulation sends a message to the control mechanism indicating the time at which the breakpoint occurred (arrow 425). In order to facilitate synchronization of the various simulations, the processor core simulation executes in a run-ahead loop and allows other simulations to catch up after a breakpoint is hit, in one embodiment. As previously discussed, the simulations may be invoked by the simulation kernel thread to each execute up to a pre-determined number of clock cycles. If a simulation hits a breakpoint while executing its quantum of clock cycles, it notifies the simulation kernel thread of the time at which the breakpoint is hit such that the other simulations can execute up to that point in time rather than the entire quantum. Thus, when the processor core simulation hits the breakpoint, it breaks from its run-ahead loop and tells the control mechanism to break at time "T," where "T" is the point where the breakpoint occurs (arrow 425). The processor core simulation then waits until it is notified by the simulation kernel thread that the other simulations have caught up.

The simulation kernel thread will schedule other simulations (e.g., other processor core simulations, hardware simulation) for execution, which allows them to synchronize (e.g., catch up) with the core processor simulation that hit the breakpoint. The control mechanism may subscribe to a time advance callback of the simulation kernel thread (arrow 430) so that it is the first to be notified when time "T" is reached. When time "T" is reached, the simulation kernel thread notifies the control mechanism (arrow 435), which then unsubscribes from the time advance notification (arrow 440) and "waits on the control mechanism" to suspend the simulation kernel thread (arrow 445). Thus, all simulations in the simulation kernel thread are suspended and are also synchronized. The debugger platform still has complete visibility of all the simulations through the debug support thread.

To re-start the simulations, the user inputs a command into the platform debugger (arrow 450). In response to the command, the platform debugger sends a message to the debug support thread to initiate re-start of the simulation (arrow 455). In response thereto, the debug support thread signals the control mechanism to re-start the simulation kernel thread (arrow 460). The simulation kernel responds to the control mechanism by re-starting execution of all simulations (arrow 465).

A user may also wish to break at a certain simulation time (or have complex breakpoint conditions that involve time). This can be implemented very similar to a breakpoint depicted in FIG. 4. In one embodiment, an event is scheduled in the simulation at the time specified by the user. When this event is triggered by the simulation, it sends a message to the control mechanism passing the current time as a parameter (similar to arrow 425 in FIG. 4). Then steps similar to arrows 430, 435, and 440 of FIG. 4 may be taken in order to help synchronize the simulations. When the control mechanism receives a callback from the simulation kernel (similar to arrow 435 of FIG. 4) the simulation kernel thread will wait on the control mechanism (similar to arrow 445 of FIG. 4).

Figure 5:
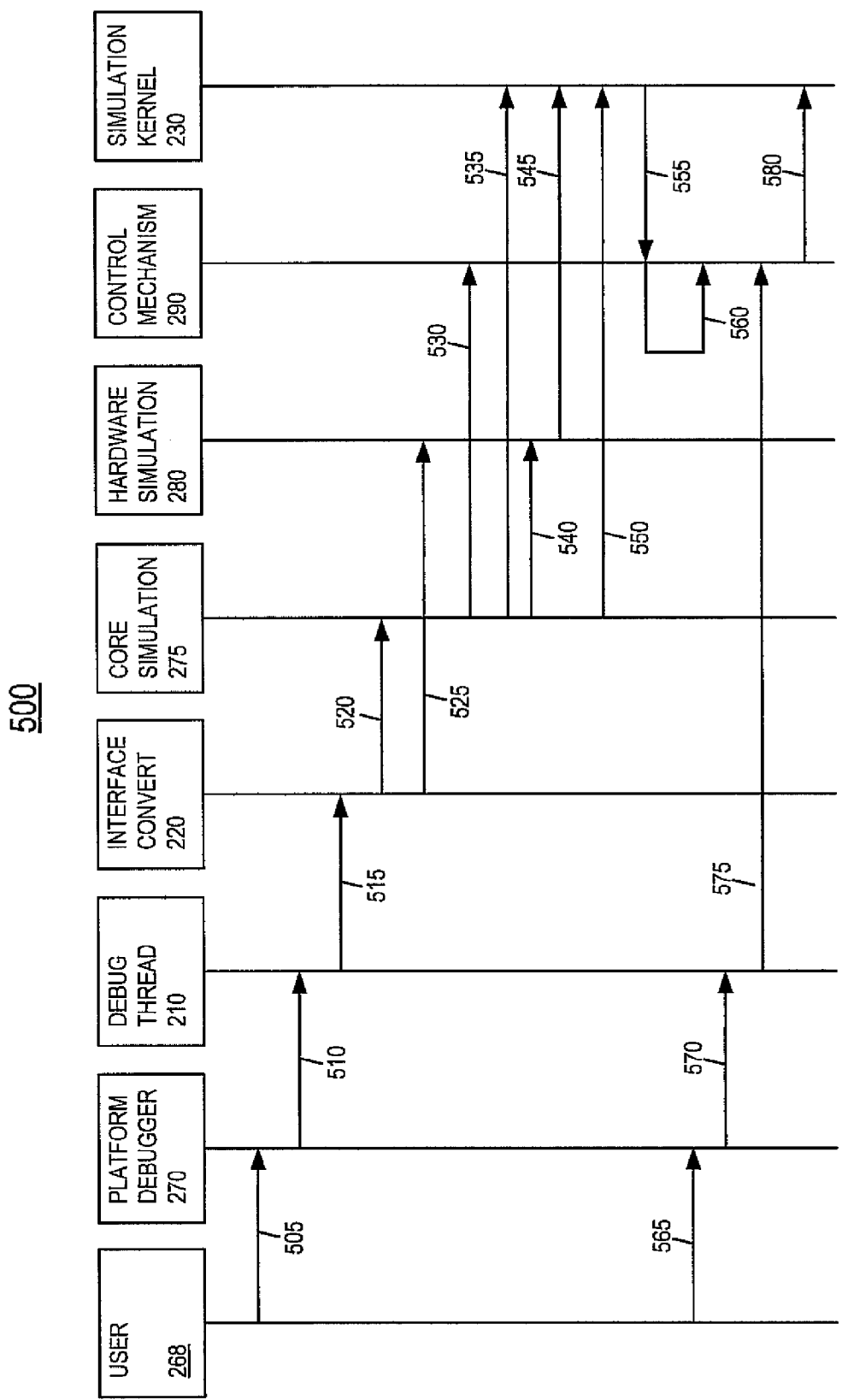
FIG. 5 depicts a sequence diagram for implemented a watchpoint, in accordance with an embodiment of the present invention.

Watchpoints may be used to suspend the simulation when a hardware register is read or written, in embodiments of the present invention. FIG. 5 depicts a sequence diagram for implementing a watchpoint 500, in accordance with an embodiment of the present invention. A user 268 inputs the desired watchpoint to the platform debugger (arrow 505). In response, the platform debugger sends a message to the debug support thread indicating the watchpoint (arrow 510). The debug support thread invokes the interface converter to send messages to a processor core simulation and to the hardware simulation indicating the watchpoint (arrows 515, 520, and 525). In this case, the watchpoint is an event (e.g., memory or register access) that the hardware simulation will detect. The processor core is made aware of the watchpoint for purposes of synchronizing the halting of the simulations, which will be discussed herein below.

In one embodiment, the processor core simulation runs "ahead of time." If the processor core simulation model determines that it is about to access a part of the hardware that has a watchpoint associated with it, the processor core simulation model will first synchronize with the other simulation models before doing the hardware access, effectively allowing them to "catch up." Thus, the processor core simulation model may notify the control mechanism (arrow 530) and the simulation kernel (arrow 535) as if a breakpoint were hit. The simulation kernel may then schedule other simulation models to allow them to catch up to the processor core simulation model.

However, instead of halting the simulation thereafter, the processor core simulation model continues and executes the instruction that accesses the hardware simulation (arrow 540). If the hardware simulation detects that the watchpoint is hit, it notifies the simulation kernel of this fact (arrow 545). As soon as the hardware access is over, control is returned to the processor core simulation model, which asks the simulation kernel to process any watchpoint that have been hit by the previously executed instruction (arrow 550). If the simulation kernel determines the watchpoint was hit, it "waits on the control mechanism" to suspend the simulation kernel thread (arrows 555 and 560).

To re-start the simulations, the user inputs a command into the platform debugger (arrow 565). In response to the command, the platform debugge sends a message to the debug support thread to initiate re-start of the simulation (arrow 570). In response thereto, the debug support thread signals the control mechanism (arrow 575). The simulation kernel responds to the control mechanism by re-starting execution of all simulations (arrow 580).

Exemplary Computer Platform

Figure 6:
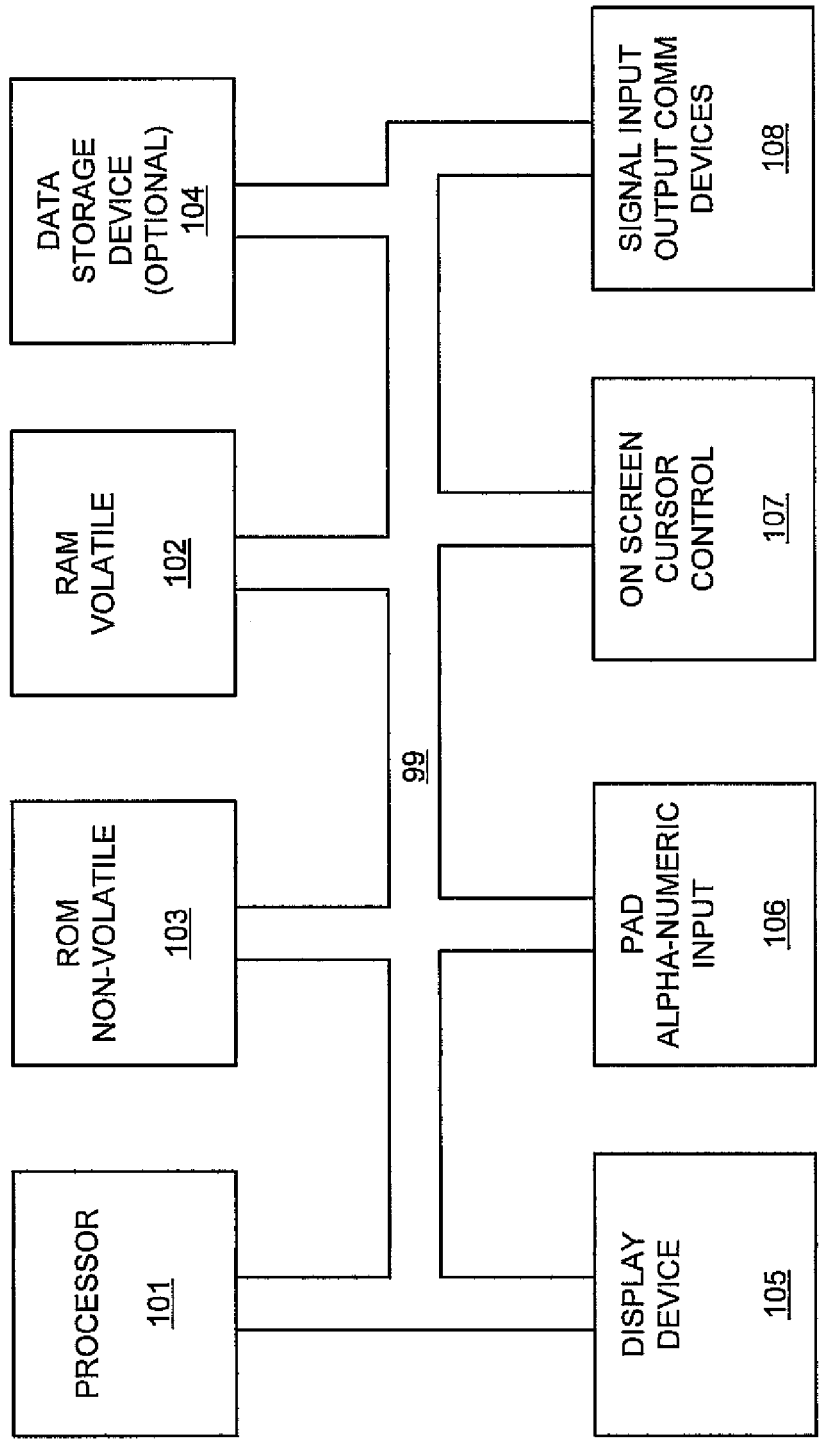
FIG. 6 is an exemplary computer system that may serve as a platform upon which embodiments of the present invention may be executed.
Figure 9:
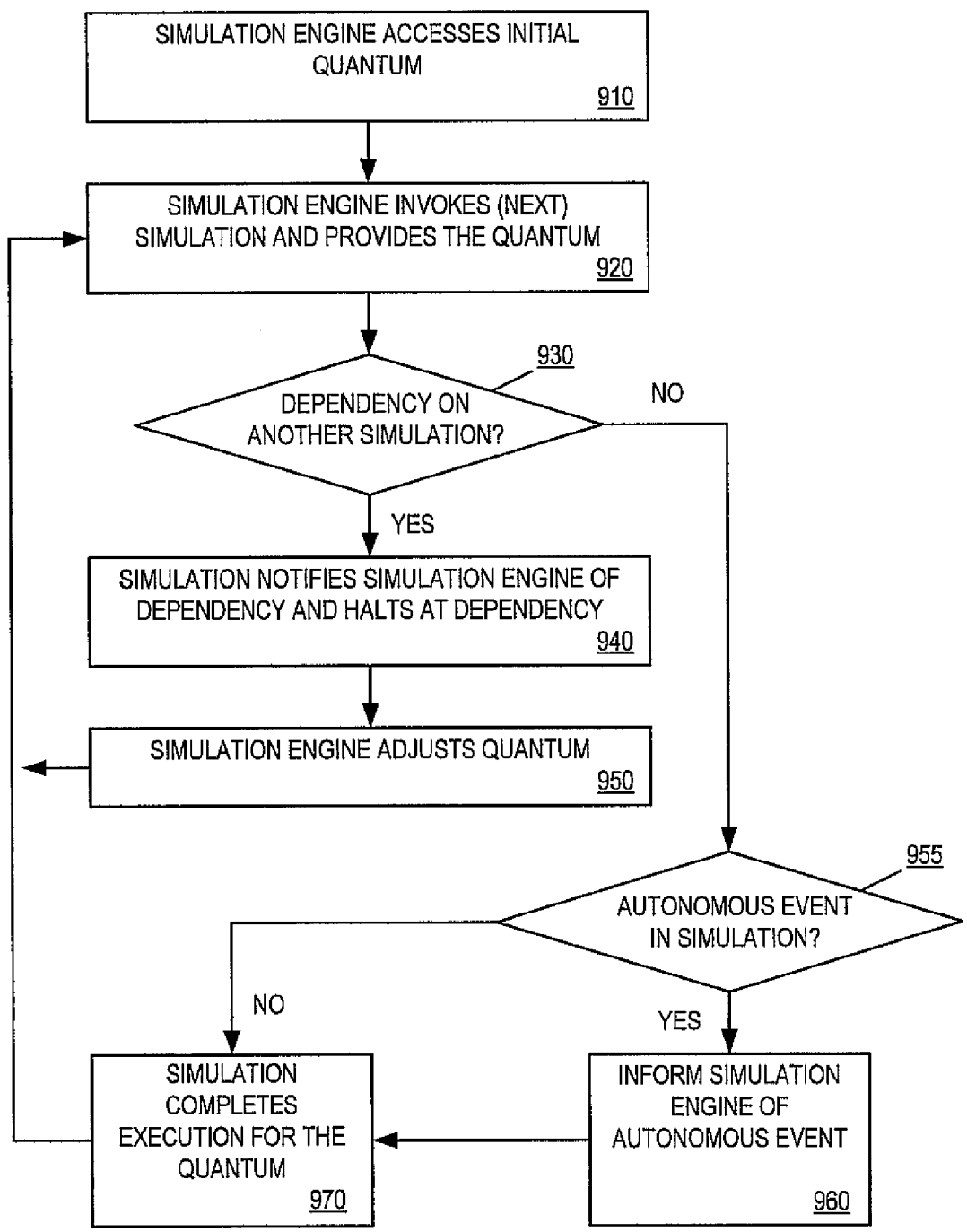
FIG. 9 is a flowchart illustrating steps of a process of performing a simulation of a computer system platform, in accordance with the present invention.
Figure 10:
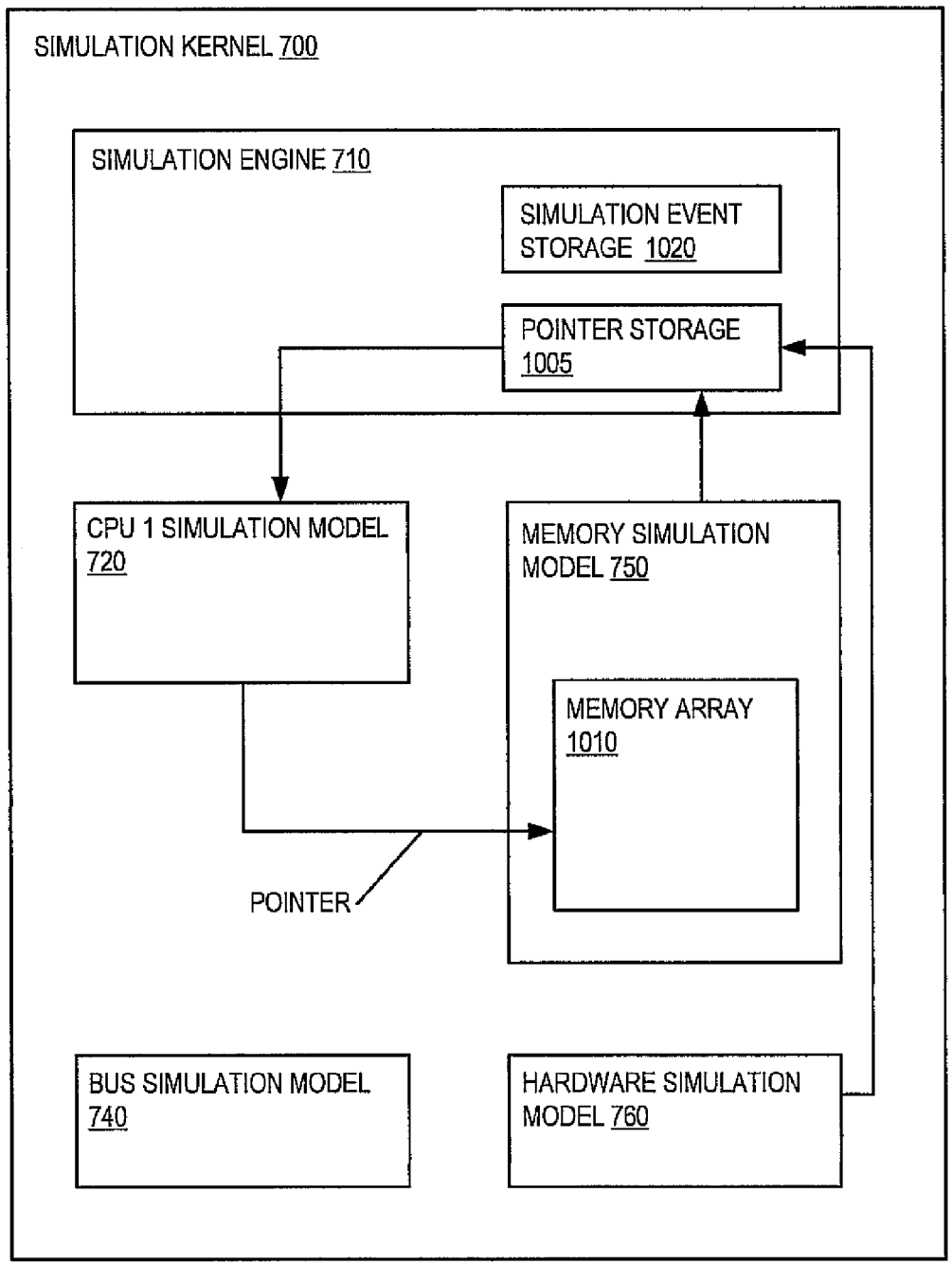
FIG. 10 is a block diagram of a simulation kernel illustrating backdoor memory accesses, in accordance with the present invention.

FIG. 6 illustrates circuitry of an exemplary computer system 100, which may form a platform for embodiments of the present invention. Computer system 100 may serve as a platform for the platform debugger (270, FIG. 2), the simulation process (210, FIG. 2), the simulation kernel (FIG. 7, 700; FIG. 10, 1000), or process 900 (FIG. 9). In some embodiments, the platform debugger and simulation process execute computer system 100. In other embodiments, they execute on separate computer systems.

Computer system 100 includes an address/data bus 99 for communicating information, a central processor 101 coupled with the bus for processing information and instructions, a volatile memory 102 (e.g., random access memory RAM) coupled with the bus 99 for storing information and instructions for the central processor 101 and a non-volatile memory 103 (e.g., read only memory ROM) coupled with the bus 99 for storing static information and instructions for the processor 101. The instructions may include steps of process 300 of FIG. 3 or process 900 of FIG. 9. Computer system 100 also includes an optional data storage device 104 (e.g., a magnetic or optical disk and disk drive) coupled with the bus 99 for storing information and instructions. The simulation results may be stored optional data storage device 104 or volatile memory 102.

With reference still to FIG. 6 system 100 may also include an alphanumeric input device 106 including alphanumeric and function keys coupled to bus 99 for communicating information and command selections to central processor unit 101. For example a user may input commands to the platform debugger via alphanumeric input device 106. System 100 may also include a cursor control device 107 coupled to bus 99 for communicating user input information and command selections to central processor unit 101. System 100 of the present embodiment may also include a display device 105 coupled to bus 99 for displaying information. For example, the platform debugger may be a graphical debugger capable of displaying data and graphics from the simulations. In one embodiment, the platform debugger executes on a device external to computer system 100. Computer system 100 has a signal input/output communication device 108 coupled to bus 99 providing communication with external devices for this and other purposes.

Dynamically Adjusting Speed Versus Accuracy of Computer Platform Simulation

Figure 7:
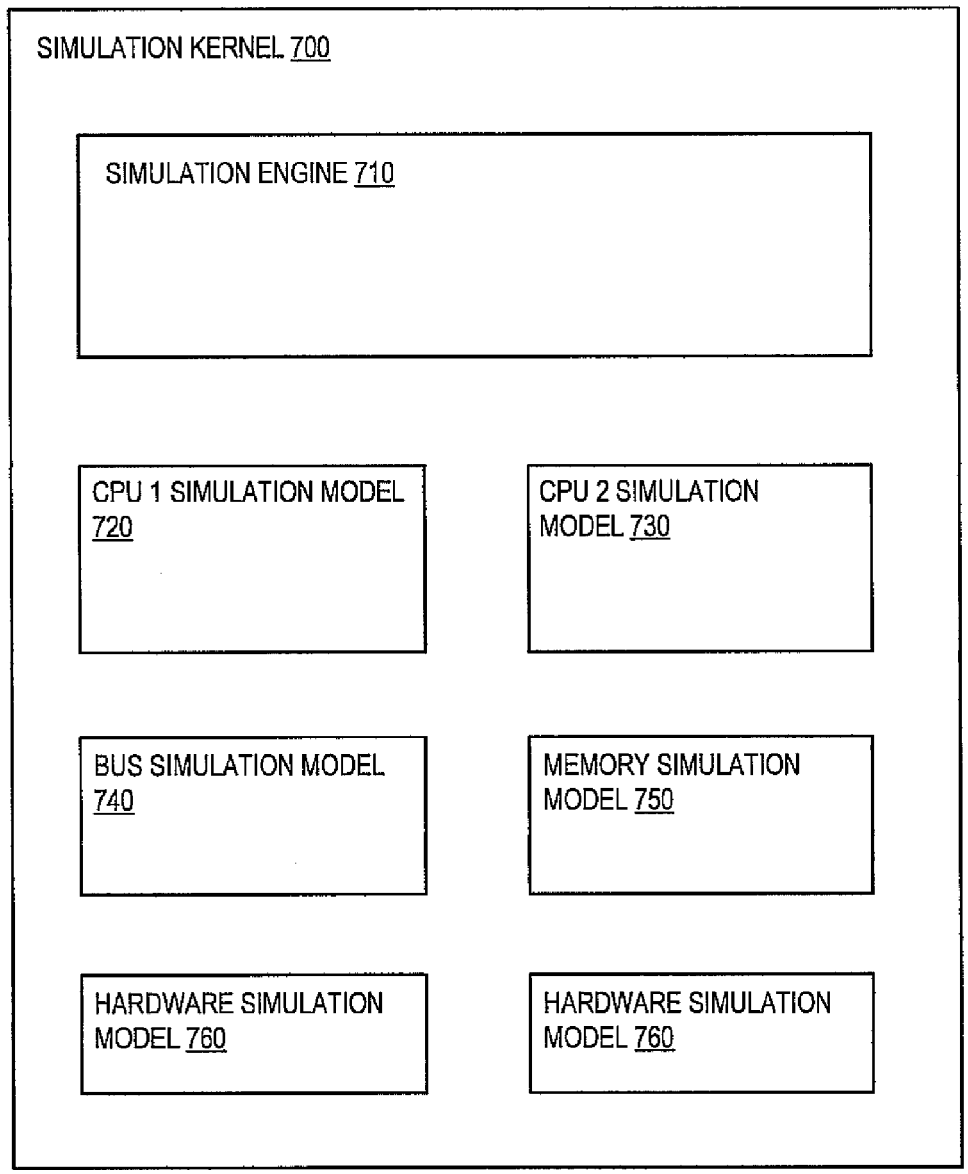
FIG. 7 is a block diagram illustrating a simulation kernel in accordance with an embodiment of the present invention.

FIG. 7 is a block diagram illustrating a simulation kernel in accordance with an embodiment of the present invention. The same overall simulation comprising simulation models 720, 730, 740, 750, 760 can be dynamically tuned for more accuracy or for more speed. The simulation results will be behaviorally correct even when the overall simulation is tuned for maximum speed. For example, the user selects a desired accuracy level and the simulation engine 710 can dynamically decide to temporarily increase accuracy to ensure behavioral correctness. The simulation engine 710 should not simulate with less accuracy than requested by the user.

The simulation models 720, 730, 740, 750, 760 are capable of cycle accurate simulation, in one embodiment. However, the simulation models may be executed in a mode that is less than cycle accurate, while still achieving behaviorally correct simulation results. Embodiments of the present invention increase simulation speed without sacrificing accurate results by reducing the impact of simulation bottlenecks. An example of a bottleneck in the simulation is the communication between one of the CPU simulations 720, 730 and the memory simulation 750. Another example of a bottleneck is between one of the CPU simulations 720, 730 and one the hardware simulations 760, which may be modeling a peripheral component. Moreover, a bus simulation 740 may be invoked in a cycle-accurate simulation, which provides greater simulation accuracy but may reduce the simulation efficiency.

For a cycle accurate simulation, clock signals may be used to synchronize the different simulations (as may be done in the architecture being simulated). A large portion of the work of the simulation engine 710 is to manage and schedule clock signals. Embodiments of the present invention reduce the simulation engine's clock management workload by reducing the number of times that the simulations (e.g., 720, 730, 740, 750, 760) are synchronized. Instead of synchronizing the simulations each clock cycle, embodiments of the present invention synchronize every "quantum" of execution units. The "quantum" is a number of clock cycles in one embodiment. However, the quantum may be any convenient unit of execution.

Using a quantum allows a simulation to execute many clock cycles without having to stop to synchronize. For example, a CPU simulation model may execute dozens, hundreds, thousands or more instructions in a row, without having to stop to synchronize with the other simulation models. The CPU simulation may not be dependent upon an event in another simulation for a substantial time period. Thus, the CPU simulation result may be behaviorally accurate without synchronizing even though the CPU simulation is not cycle-accurate.

Figure 8A:
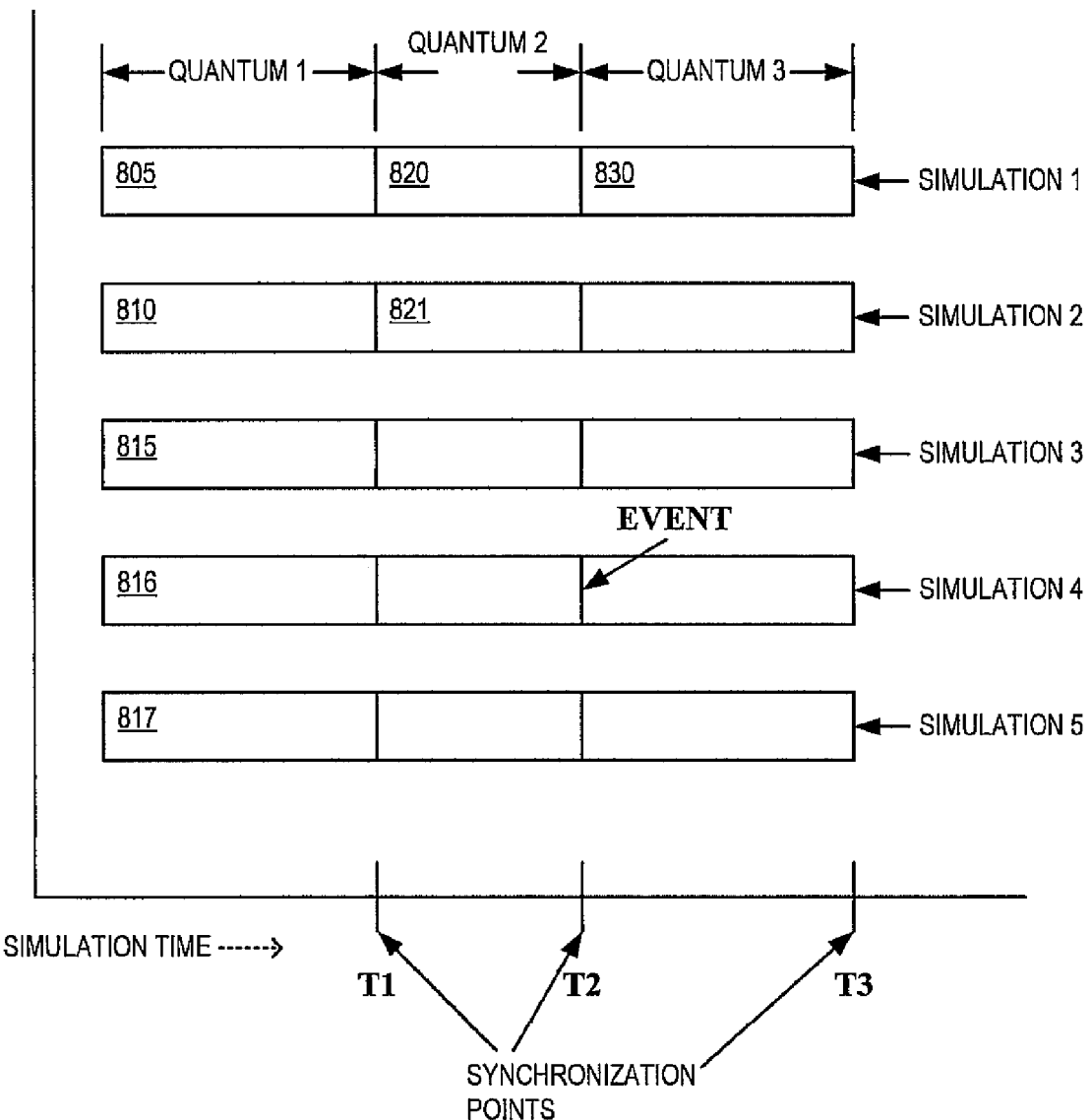
FIG. 8A is a diagram illustrating dynamically modifying a quantum of execution units performed by simulation while maintaining behaviorally correct results, in accordance with an embodiment of the present invention.

Referring to FIG. 8A, the simulations may be invoked by the simulation engine, wherein each simulation is allowed to execute up to the quantum of execution units (e.g., clock cycles) without stopping, for example, to synchronize with another simulation. Thus, simulation 1 may execute its quantum (block 805), followed by simulation 2 (block 810), then the rest of the simulations may be invoked (blocks 815, 816, 817. At that point, the simulations are synchronized (Simulation Time T1). It is not required that the simulations be executed one at a time. For example, the simulation models could execute in parallel on different processors of a multiprocessor system. However, the simulation models are allowed to execute a quantum of instructions without the need to stop and synchronize with another simulation.

It is not required that each of the simulations are actually invoked every time it has a chance to run. For example, it is possible that a hardware simulation may not have any work to do for its quantum, in which case it might not be invoked or invoked and shut down quickly. In some embodiments of the present invention, the simulation models have an internal clock that is shut off when the simulation is asleep to save the overhead of the clock running. Thus, the simulations can be written to be responsive, as opposed to having autonomous behavior. As an example, peripheral hardware may be modeled to be responsive or mostly responsive rather than autonomous. Furthermore, the bus simulation model may also be written to be responsive. This allows a processor simulation to execute very large numbers of instructions, while still providing a behaviorally accurate simulation.

To ensure behavioral correctness of the simulation, the quantum may be dynamically adjusted so that a simulation does not run past an autonomous event scheduled in another simulation. Referring again to FIG. 4, an autonomous event may be scheduled to occur in simulation 4 at a known time. Simulation 4 informs the simulation engine of this autonomous event and its simulation time at some convenient time prior to the autonomous event. The simulation engine stores this and other simulation events (FIG. 10, 1020). The simulation engine dynamically adjusts the quantum such that other simulations do not run past this autonomous event.

In a typical scenario, the autonomous event may be an event scheduled to take place in a hardware simulation. An embodiment of the present invention typically schedules a processor simulation prior to memory and hardware simulations. Thus, in order to keep the processor simulation from running past the scheduled event in, for example, a hardware simulation, the quantum is reduced in size prior to the processor simulation being invoked. If the frequency of events in memory, bus, or hardware simulations is too high, the quantum can be negatively impacted. However, as described below, embodiments of the present invention provide for techniques to reduce the impact of such events, wherein the quantum is not impacted by certain classes of events. These events are not necessarily autonomous events.

Thus, referring again to FIG. 8A, each simulation executes for quantum 1. Simulation 4 has an event scheduled at simulation time T2. Therefore, quantum 2 is reduced to end at simulation time T2. The reduction is done prior to simulation 1 being invoked to execute its block 820, such that all simulations execute for the reduced quantum and do not run past the autonomous event. After simulation 1 returns control to the simulation engine, simulation 2 is then invoked to execute (block 821). Simulations 3-5 may then be invoked.

The size of the quantum may be based on a value input by the user. Typically, the quantum should be given the highest possible value that still gives a behaviorally correct simulation result. Thus, since there are no autonomous events scheduled between synchronization times T2 and T3, the quantum is increased back to it maximum possible value (quantum 3). The simulation engine should not increase the quantum to a value larger than the user-specified value.

Figure 8B:
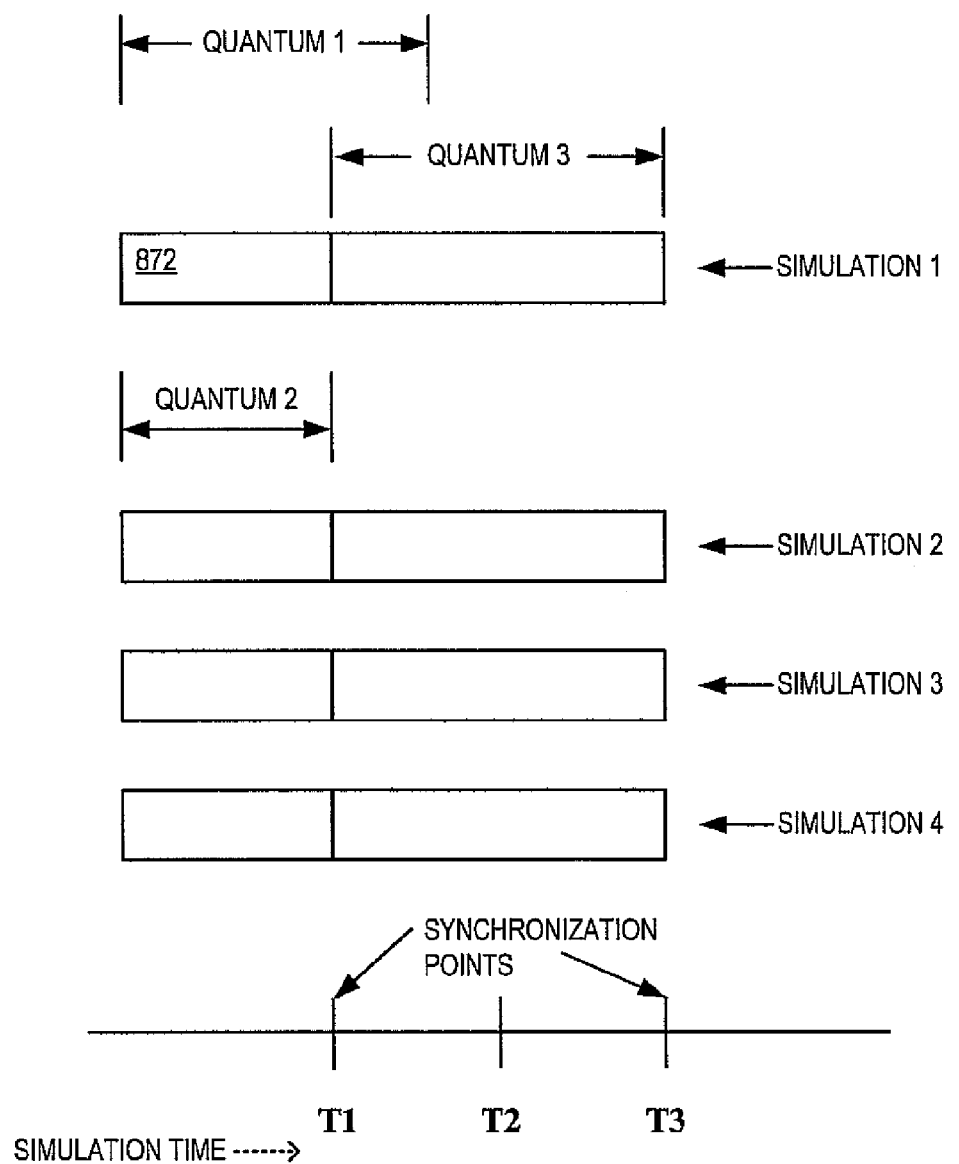
FIG. 8B is a diagram illustrating dynamically modifying a quantum when a simulation detects a dependency on another simulation or a halting point in its simulation, in accordance with an embodiment of the present invention.

In some cases, a simulation is able to determine that it should halt prior to completion of its maximum quantum of execution units based on either an event in its simulation or one that it may trigger in another simulation model. Referring to FIG. 8B, initially the quantum is "quantum 1" (ending at simulation time T2) and no known dependencies exist that would indicate the quantum should be shortened. However, simulation 1 stops its execution partway through its quantum of execution units (block 872). This may occur because simulation 1 determined that it has a dependency on another simulation at simulation timeT1 such that it cannot continue behaviorally accurate simulation. Alternatively, simulation 1 may have hit a breakpoint or watchpoint. Or simulation 1 may determine that it may cause an event in another simulation. For example, simulation 1 may determine that by writing to a register in another simulation it may cause a watchpoint in that other simulation to be hit. Simulation 1 will inform the simulation engine of the stopping point (T1) when returning control to the simulation engine.

The simulation engine then dynamically adjusts the quantum to "quantum 2" so that the rest of the simulations stay synchronized with simulation 1. The simulation engine then invokes simulations 2-4 to execute up to the quantum, which has been dynamically modified to "quantum 2." Then, the simulation engine may invoke simulations 1-4 to execute to simulation time T3 by dynamically modifying the quantum to "quantum 3."

Figure 8C:
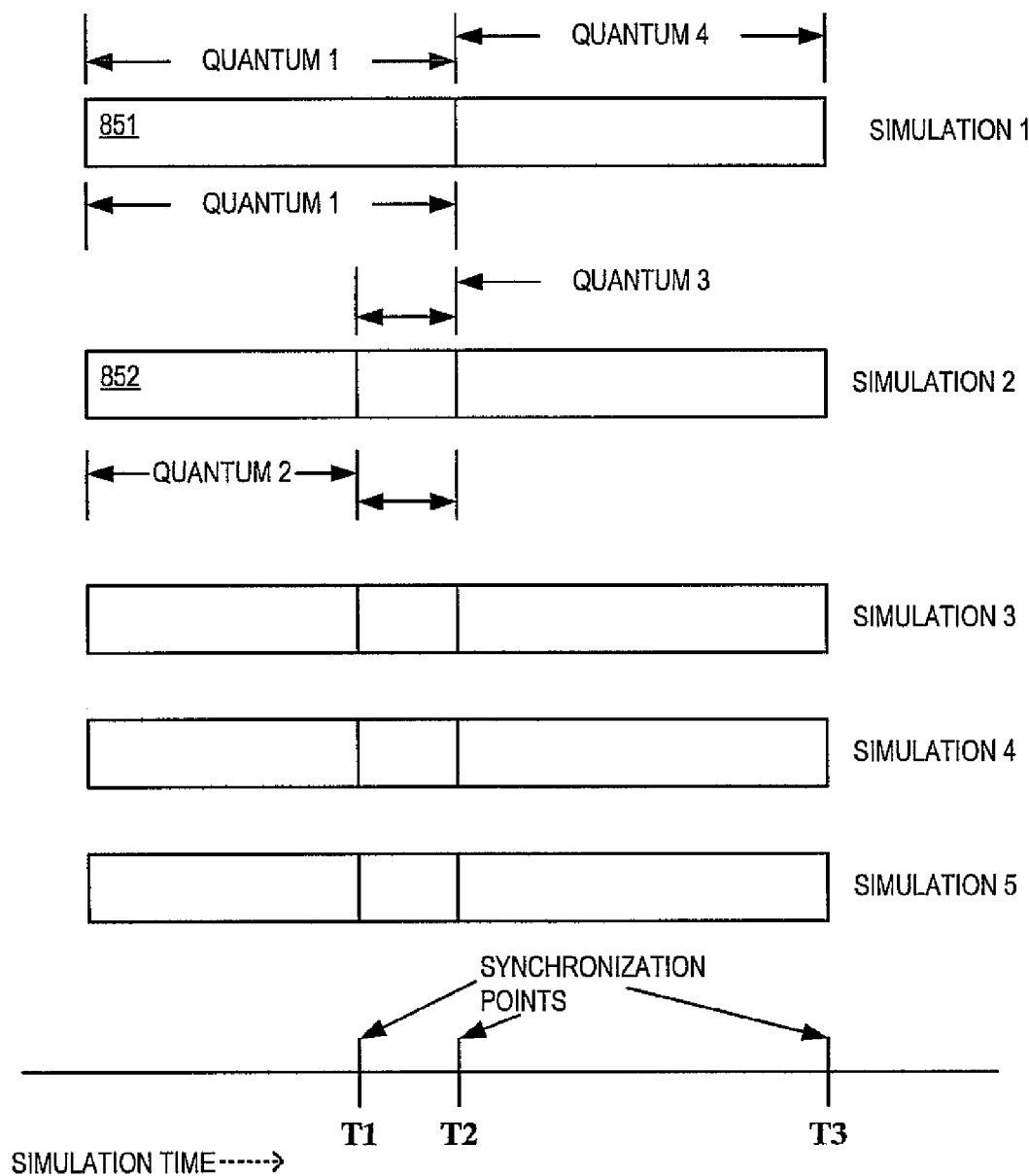
FIG. 8C is a diagram illustrating dynamically modifying a quantum when a simulation runs ahead of other simulations, in accordance with an embodiment of the present invention.

In some cases, it is unknown that an event will occur in a simulation that would cause another simulation to get ahead in execution. Referring to FIG. 8C, initially the quantum is "quantum 1" and simulation 1 executes its quantum of execution units entirely (block 851). When simulation 2 is invoked the quantum is still "quantum 1" because no known dependencies exist that would indicate the quantum should be shortened. However, simulation 2 stops its execution partway through its quantum of execution units (block 852). This may occur because simulation 2 determined that it has a dependency on another simulation at simulation time T4 such that it cannot continue behaviorally accurate simulation. Alternatively, simulation 2 may have hit a breakpoint or watchpoint. Simulation 2 will inform the simulation engine of the stopping point (T4) when returning control to the simulation engine.

The simulation engine then dynamically adjusts the quantum to "quantum 2" so that the rest of the simulations stay synchronized with simulation 2. The simulation engine then invokes simulations 3-5 to execute up to the quantum, which has been dynamically modified to "quantum 2." Simulations 2-5 will be synchronized at simulation time T4. It is not required that simulation 1 be synchronized with the rest of the simulations at this point. If a user views simulation results at this point, the user will be informed that simulation 1 has "run ahead of time" and is stopped at simulation time T5. When the simulations are restarted, the simulation engine may invoke simulations 2-5 to execute to simulation time T5 by dynamically modifying the quantum to "quantum 3." Then, the quantum may be re-set to a higher value for more efficient simulations (quantum 4), wherein simulations 1-5 are invoked and allowed to execute up to simulation time T6 without any of the simulation models stopping to synchronize with another simulation model.

FIG. 9 is a flowchart illustrating steps of a computer-implemented process 900 of performing a simulation of a computer system platform, in accordance with the present invention. In Step 910, a simulation engine accesses an initial value for a quantum. The initial value is typically received from a user and is typically a maximum value that the quantum can ever be in the simulation. The quantum is dynamically adjustable, wherein the current value of the quantum specifies a maximum number of units of execution a simulation is allowed to perform. The user may change the quantum during the execution of the simulation, without having to recompile the simulation. Therefore, the user may adjust the dynamic quantum to select between a between a cycle accurate simulation mode and a behaviorally accurate simulation mode.

Step 920 comprises the simulation engine invoking a first simulation for execution and informing the simulation of the current value of the quantum. Thus, the simulation is aware of the maximum number of units of execution it is allowed to perform.

The simulation is not required to complete all of the execution units. For example, if the simulation identifies a dependency on another simulation in step 930, it halts in step 940. Moreover, in step 940 the simulation notifies the simulation engine of the time at which it halted. Thus, in step 950, the simulation engine modifies the dynamic quantum. Then, the process 900 returns to step 920 wherein the simulation engine invokes the next simulation, providing it with the current value of the dynamic quantum.

However, in the typical case, a simulation will complete the entire quantum of execution units. If the simulation is aware of an autonomous event in its simulation (step 955), it may inform the simulation of this in step 960. For example, a hardware simulation may inform the simulation engine that it has an upcoming autonomous event so that it will be awoken to simulate the autonomous event. Moreover, the simulation engine may modify the quantum to prevent other simulations from running ahead of this autonomous event. The simulation engine keeps track of this and other autonomous events, such that it may modify the dynamic quantum at the appropriate time.

In step 970, the simulation completes and returns control to the simulation engine. The process 900 then returns to step 920, wherein the simulation engine invokes the next simulation model.

As discussed above, autonomous events can impact the quantum. However, most hardware simulations may be modeled to be entirely responsive, or at least mostly responsive, e.g., they have none or little autonomous behavior. The real-world hardware typically has a high frequency clock signal that may be used to guide a state machine. As a consequence, conventional hardware simulation models typically include a high frequency clock signal and a state machine. However, because the hardware is typically accessed infrequently, this modeling style may cause substantial overhead because on the vast majority of clock cycles the hardware does no work. This modeling style can be achieved by the present invention if the dynamic quantum were set to one clock cycle, since the simulation engine would interact with the hardware simulations every clock cycle.

However, embodiments of the present invention provide a much more efficient hardware simulation model. These simulation modes may be described as functional models, which simulate the function of the hardware instead of the actual hardware implementation. Thus, the hardware simulation model normally "sleeps" and is "woken up" by incoming communication. The hardware simulation model then executes the needed behavior and goes to "sleep" again. If a hardware simulation model needs to execute behavior in the future, it asks the simulation engine to wake it up again at that time in the future and goes to "sleep" again. The vast majority of hardware (e.g., peripherals) can be modeled in this fashion. Moreover, busses and memory can be modeled in this functional fashion, as well.

Because these functional simulations do not use clock signals, this removes one of the bottlenecks. Moreover, the quantum will only be limited dynamically whenever a processor simulation model actually accesses the hardware simulation, which normally happens with a relatively low frequency, meaning the dynamic quantum can often be equal to a maximum value specified by a user.

Another embodiment of the present invention provides for bypassing invocation of a simulation model to bypass a non-autonomous simulation event when behavior of the non-autonomous simulation event is not desired. In one embodiment, "backdoor memory accesses," are used in order to improve simulation efficiency. The backdoor memory access can bypass a simulation event that might impact the quantum. The bypassed events may be non-autonomous events. For example, for every instruction that a real-world processor executes, there is at least one memory access, e.g., the opcode fetch. Thus, it is possible to simulate this by invoking the processor simulator and the memory simulator (along with the bus simulator). Invoking the simulators in this fashion could cause the dynamic quantum to be very low, typically two or three clock cycles.

However, the memory and bus simulation models do not need to be invoked for correct and accurate behavior of a processor simulation memory access. Thus, rather than invoking the memory (and bus) simulation models, an embodiment of the present invention directly reads the memory in the memory simulation model. Referring to FIG. 10, a memory simulation model 750 may allocate a large array 1010 of bytes to model the memory. When a communication request comes into the memory simulation model 750, the memory simulation indexes into the array and returns the proper value.

However, rather than invoking the memory simulation 750, as just described, an embodiment of the present invention performs a "backdoor access," in which the memory simulation 750 is not invoked. With a backdoor access, instead of going over the bus, the processor simulation 720 uses a pointer to index the memory array 1010. The simulation engine has pointer storage 1005 and receives pointers from the memory model 750, and possibly other simulation models. Neither the bus simulation 740 nor the memory simulation model 750 need be invoked. Therefore, the quantum is not impacted by this event. The user may be allowed to specify whether such backdoor accesses are permitted or not.

Backdoor memory accesses may reduce the accuracy of the simulation. One reason for reduced accuracy is that a backdoor access may take zero simulation time. Typically, a real CPU to memory access over the bus would require several clock cycles. Thus, an embodiment of the present invention allows a user to estimate the number of clock cycles that a backdoor access would take and input this as a simulation parameter. More than one estimate can be provided, based on the type and/or sequence of accesses (e.g., read, write, write followed by read, etc.) The processor simulation 720 factors in the estimated access time when it determines the number of instructions it can execute within its quantum. Thus, the potential loss of simulation accuracy is reduced or eliminated by factoring in the estimate.

Backdoor accesses may apply to other than instruction fetches. In one embodiment, the processor simulation model understands when it is safe to perform a backdoor access. That is, the processor simulation model understands when a behavior that should be simulated is associated with the memory access. If there is such a behavior, then the processor simulator does not perform a backdoor memory access.

Furthermore, a backdoor access can apply to other than a memory simulation. This allows a more efficient simulation for pieces of hardware that may be frequently accessed. Thus, the hardware simulation may also provide one or more pointers to the simulation engine.

In one embodiment, the backdoor access does not use the bus simulation model or the memory (or hardware) simulation model. In this case, the backdoor access does not trigger the behavior associated with the memory (or hardware) access. In another embodiment, the backdoor access does not use the bus simulation model but does invoke the memory (or hardware) simulation model. In this case, the backdoor access does trigger the behavior associated with the memory (or hardware) access.

The user is allowed to select backdoor accesses "on the fly." For example, a graphical user interface, such as a debugging tool, allows the user to specify which simulations may perform backdoor accesses. Furthermore, the user may be allowed to specify under what conditions backdoor accesses are allowed. For example, a user may specify that backdoor accesses are allowed for only instruction fetches. Further, embodiments of the present invention allow selection of backdoor access on a per component basis within a given simulation model. For example, the backdoor access may be specified on a register-by-register basis. The user can modify any of the backdoor access parameters without the need to re-compile the simulation.

There may be cases, in which dynamic adjustment of the quantum is insufficient to get correct behavioral simulation results. For example, consider a dual processor system in which CPU2 monitors a piece of memory that is shared by both CPU1 and CPU2. The software running on CPU1 will write data to the shared memory that CPU2 processes. A conventional way of communicating between the CPUs is by means of interrupt signals. By sending back and forth interrupts, CPU2 knows that CPU1 has written to the shared memory and CPU1 knows that CPU2 has read the shared memory. If the simulation has knowledge of the interrupt, then the simulation can stop execution prior to completing its quantum, such that it will not run past the interrupt event.

However, the software developer may avoid using an interrupt by exploiting the fact that it is known which software is running on both CPU's. For example, if it is known that CPU1 will put a new element in the shared memory every 20 clock cycles, then that knowledge can be exploited in CPU2. If CPU1 is aware that CPU2 exploits that knowledge, then CPU1 can know when it is safe to overwrite the shared memory based on the shared timing knowledge, rather than using an interrupt.

However, the simulation models may be unaware of this timing knowledge. For example, if an interrupt is used, the simulation may have explicit information regarding the interrupt. However, if the aforementioned timing knowledge is used instead of interrupts, the simulation may not contain explicit information about the timing of the shared memory accesses. An embodiment of the present invention prevents possible incorrect simulation results that may occur due to such dependencies that are not explicitly indicated in the simulations.

The following example will serve to illustrate a possible incorrect result, which is avoided by an embodiment of the present invention. The software developer may program CPU1 to write to shared memory every 20 clock cycles and CPU2 to read the shared memory every 20 clock cycles. However, this timing information may not be explicitly obtainable from the simulations. If the quantum were set to 100 clock cycles, CPU1 could overwrite the shared memory before CPU2 would read the shared memory (or vice versa). Thus, the simulation results will likely be incorrect. An embodiment of the present invention allows the user to set a maximum value of the quantum. The simulation engine may only dynamically reduce the quantum, in this embodiment. In this case, the quantum might be limited by the user to 20 clock cycles (e.g., the resolution of timing based communication between both CPUs).

In many systems the processor is the only real autonomous block and memory and hardware accesses are infrequent. More complex systems have one or more autonomous blocks besides the CPU or may have multiple CPUs. In one embodiment of the present invention, each autonomous simulation model may have its own quantum. For example, the dynamic quantum may be adapted to a specific simulation, or it may be individually adapted to a plurality of autonomous simulations. Simulation models that are wholly or largely responsive (e.g., non-autonomous) may have their quantum set to the lowest quantum in current use.

The preferred embodiments of the present invention are thus described. While the present invention has been described in particular embodiments, it should be appreciated that the present invention should not be construed as limited by such embodiments, but rather construed according to the below claims.

What is claimed, is:

1. A computer-implemented method of executing a simulation of a computer platform, said simulation comprising a plurality of simulation models, said method comprising:
   accessing a dynamic quantum whose current value specifies a maximum number of units of execution that a first simulation model of said plurality of simulation models is allowed to perform;
   invoking respective simulation models of said plurality of simulation models for executing said first simulation model and a second simulation model simultaneously; and
   providing the current value of said dynamic quantum to each of said simulation models when invoking each of said simulation models,
   wherein said executing said first simulation model renders a unified view of said plurality of simulation models, and wherein said first simulation model directly accesses memory of said second simulation model to avoid invoking said second simulation model to avoid a dependency that would otherwise cause said first simulation model to halt prior to completing said maximum number of units of execution.

2. A computer-implemented method as recited in claim 1, further comprising modifying said current value of said dynamic quantum based on a simulation event.

3. A computer-implemented method as recited in claim 2, wherein said simulation event comprises a notification from said first simulation model of said plurality of simulation models that said first simulation model did not complete said maximum number of units of execution.

4. A computer-implemented method as recited in claim 2, wherein said simulation event comprises a notification from said first of said plurality of simulation models of a scheduled event.

5. A computer-implemented method as recited in claim 1, wherein said units of execution comprise clock cycles.

6. A computer-implemented method as recited in claim 1, wherein said accessing said dynamic quantum comprises receiving user input.

7. A computer-implemented method as recited in claim 1, further comprising:
   detecting a dependency of an event in said first simulation model of said plurality of simulation models involving said second simulation model of said plurality of simulation models;
   halting said first simulation model in response to said detecting the dependency; and
   modifying said current value of said dynamic quantum prior to invoking a next simulation model of said plurality of simulation models.

8. A computer-implemented method as recited in claim 1, wherein said accessing the dynamic quantum allows user-selection between a cycle accurate simulation mode and a behaviorally accurate simulation mode of executing said plurality of simulation models.

9. A computer readable medium having stored thereon instructions for implementing a method of simulating a computer platform, said instructions comprising:
   a plurality of simulations for modeling portions of said computer system platform; and
   a simulation engine operable to control execution of said plurality of simulations based on a dynamic quantum, wherein said simulation engine instructs respective simulations of said plurality of simulations to perform a number of execution units up to the current value of said dynamic quantum, wherein a first simulator of said plurality of simulations and a second simulator of said plurality of simulations are executed simultaneously, wherein said simulation engine detects a dependency of an event in said first simulator of said plurality of simulations involving said second simulator of said plurality of simulations, and wherein said simulation engine halts said first simulator in response to said detecting said dependency, and wherein said simulation engine modifies said current value of said dynamic quantum prior to invoking a next simulator of said plurality of simulations, wherein simulating said computer platform renders a unified view of said plurality of simulation models.

10. A computer readable medium as recited in claim 9, wherein said simulation engine is further operable to modify said dynamic quantum based on a simulation event.

11. A computer readable medium as recited in claim 10, wherein said plurality of simulations are operable to report simulation events to said simulation engine that indicate said dynamic quantum should be modified.

12. A computer readable medium as recited in claim 9, wherein said first simulation of said plurality of simulations is operable to notify said simulation engine that said first simulation did not complete said number of execution units up to the current value.

13. A computer readable medium as recited in claim 9, wherein said first simulation of said plurality of simulations is operable to notify said simulation engine when an autonomous event will occur such that said first simulation is awoken prior to said autonomous event.

14. A computer readable medium as recited in claim 9, wherein the simulation engine is further operable to record autonomous simulation events and to modify said quantum based on said autonomous events.

15. A computer readable medium as recited in claim 9, wherein said dynamic quantum is individually adapted to a plurality of autonomous simulations of said plurality of simulations.

16. A computer readable medium as recited in claim 15, wherein said simulation engine applies a lowest dynamic quantum to non-autonomous simulations of said plurality of simulations.

17. A computer readable medium as recited in claim 9, wherein a simulation of said plurality of simulations halts on an explicit dependency.

18. A computer readable medium as recited in claim 9, wherein said execution units comprise clock cycles.

19. A computer readable medium as recited in claim 9, wherein a value for said dynamic quantum is received from a user.

20. A computer readable medium having stored thereon instructions for implementing a method of simulating a computer platform comprising a plurality of simulation models, said method comprising:

accessing a value for a dynamic quantum from user input, wherein said value specifies a maximum number of units of execution a simulation model of said plurality of simulation models is allowed to perform without synchronizing with another simulation model of said plurality of simulation models, wherein a first simulation model of said plurality of simulation models and a second simulation model of said plurality of simulations models are performed simultaneously;

invoking respective simulation models of said plurality of simulation models;

providing the value of said dynamic quantum to each of said simulation models, wherein each of said simulation models is allowed to execute for up to said value without synchronizing with another simulation model of said plurality of simulation models; and modifying said value of said dynamic quantum based on a simulation event, wherein simulating said computer platform renders a unified view of said plurality of simulation models, and wherein said first simulation model directly accesses memory of said second simulation model to avoid invoking said second simulation model to avoid a dependency that would otherwise cause said first simulation model to halt prior to completing said maximum number of units of execution.

21. A computer readable medium as recited in claim 20, wherein said units of execution comprise clock cycles.

22. A computer readable medium as recited in claim 20, further comprising storing markers of autonomous simulation events.

23. A computer readable medium as recited in claim 22, wherein said modifying said value of said dynamic quantum based on said simulation event comprises modifying said value of said dynamic quantum based on one of said autonomous simulation events.

24. A computer readable medium as recited in claim 22, further comprising waking said first simulation model of said plurality of simulation models based on one of said autonomous simulation events.

25. A computer readable medium as recited in claim 20, wherein said method further comprises bypassing invocation of said first simulation model of said plurality of simulation models to bypass a non-autonomous simulation event for which behavior of said non-autonomous simulation event is not desired.

26. A computer readable medium as recited in claim 9, wherein said first simulator directly accesses memory of said second simulator to avoid invoking said second simulator to avoid a dependency that would otherwise cause said first simulator to halt prior to completing said maximum number of units of execution.

27. A computer readable medium as recited in claim 20, wherein said method further comprises:

detecting a dependency of an event in said first simulation model of said plurality of simulation models involving said second simulation model of said plurality of simulation models;

halting said first simulation model in response to said detecting the dependency; and modifying said current value of said dynamic quantum prior to invoking a next simulation model of said plurality of simulation models.

* * * * *